(12) United States Patent
Kim et al.

(10) Patent No.: US 10,283,367 B2
(45) Date of Patent: May 7, 2019

(54) HYDROGENATION ANNEALING METHOD USING MICROWAVE

(71) Applicant: CMTECH21 Co., Ltd., Hwaseong-si, Gyeonggi-do (KR)

(72) Inventors: Hi Chang Kim, Seoul (KR); Won-Ju Cho, Seoul (KR)

(73) Assignee: CMTECH21 Co., Ltd., Hwaseong-si (KR)

( * ) Notice: Subject to any disclaimer, the term of this patent is extended or adjusted under 35 U.S.C. 154(b) by 8 days.

(21) Appl. No.: 15/462,901

(22) Filed: Mar. 19, 2017

(65) Prior Publication Data
US 2017/0294316 A1  Oct. 12, 2017

(30) Foreign Application Priority Data

Apr. 7, 2016  (KR) .................. 10-2016-0042926
Apr. 8, 2016  (KR) .................. 10-2016-0043607
Apr. 21, 2016 (KR) .................. 10-2016-0048688

(51) Int. Cl.
*H01L 21/30* (2006.01)
*H01L 21/67* (2006.01)
(Continued)

(52) U.S. Cl.
CPC .... *H01L 21/3003* (2013.01); *H01L 21/67115* (2013.01); *H01L 27/127* (2013.01);
(Continued)

(58) Field of Classification Search
CPC ............. H01L 21/3003; H01L 29/7869; H01L 29/78672; H01L 27/127; H01L 27/1222; H01L 21/67115; H01L 27/1225
(Continued)

(56) References Cited

U.S. PATENT DOCUMENTS

2007/0166892 A1* 7/2007 Hori .................. H01L 21/28202
438/151
2008/0095816 A1* 4/2008 Gordy .................... A61L 27/26
424/422

(Continued)

FOREIGN PATENT DOCUMENTS

JP    2013-073950 A  4/2013
JP    2016-039192 A  3/2016
KR    10-2004-0026954 A  4/2004

*Primary Examiner* — Moin M Rahman
(74) *Attorney, Agent, or Firm* — Park, Kim & Suh, LLC

(57) ABSTRACT

Provided is a hydrogenation annealing method using a microwave, which performs hydrogenation annealing at a low temperature and with low power in a manufacturing process of a thin film transistor (TFT) for a display device. The hydrogenation annealing method is constituted by a loading step of loading a device requiring hydrogenation annealing into a chamber and an annealing step of irradiating a microwave having a frequency in an industrial scientific medical (ISM) band into the chamber into which the device is loaded. As hydrogenation annealing is performed at a low temperature by using the microwave for an oxide semiconductor TFT or LTPS having very large electron mobility, high integrated energy is transmitted to the device by the microwave, thereby implementing recoupling of hydrogen atoms which have been performed only at a high temperature, even at a low temperature.

7 Claims, 6 Drawing Sheets

(51) Int. Cl.
*H01L 27/12* (2006.01)
*H01L 29/786* (2006.01)

(52) U.S. Cl.
CPC ...... *H01L 27/1222* (2013.01); *H01L 27/1225* (2013.01); *H01L 29/7869* (2013.01); *H01L 29/78672* (2013.01)

(58) Field of Classification Search
USPC .............................. 438/775, 436, 478, 474
See application file for complete search history.

(56) References Cited

U.S. PATENT DOCUMENTS

2013/0075390 A1* 3/2013 Ashida .............. H01J 37/32266
 219/702
2014/0370645 A1* 12/2014 Yamaguchi ....... H01L 27/14698
 438/72
2015/0041458 A1 2/2015 Muto et al.

* cited by examiner

HYDROGENATION ANNEALING METHOD USING MICROWAVE

CROSS-REFERENCE TO RELATED APPLICATIONS

This application claims priority from Korean Patent Application No. 10-2016-0042926filed on Apr. 7, 2016, Korean Patent Application No. 10-2016-0043607 filed on Apr. 8, 2016, and Korean Patent Application No. 10-2016-0048688 filed on Apr. 21, 2016 in the Korean Intellectual Property Office, the disclosure of which is incorporated herein by reference in its entirety.

BACKGROUND OF THE INVENTION

1. Field of the Invention

The present invention relates to a hydrogenation annealing method using a microwave, which performs hydrogenation annealing at a low temperature and with low power in a manufacturing process of a thin film transistor (TFT) for a display device.

2. Background of the Related Art

As a flat display panel, a liquid crystal display (LCD) and an organic light emitting display take a central place.

Requirements in a display market include a low price, a high image quality, a high resolution, and the like and a thin film transistor (TFT) to be applied to a display switching and driving element having excellent performance without increasing cost may be required to meet the requirements.

Therefore, future technological development needs to focus on securing a TFT manufacturing technology that can manufacture a display panel having the excellent performance at the low price with such a trend.

An amorphous silicon thin film transistor (a-Si TFT) generally applied as the display driving and switching element may be uniformly formed on a large substrate with low-price cost, and as a result, the amorphous silicon thin film transistor (a-Si TFT) is a widely used element, but the amorphous silicon thin film transistor (a-Si TFT) reaches the limit with large-size and high-image quality trends.

Therefore, a high-performance TFT and a high-performance technology having higher mobility than the a-Si TFT are required. Further, as the a-Si TFT continuously operates as the maximum disadvantage, an element characteristic continuously deteriorates, and as a result, a problem in reliability in which initial performance cannot be maintained occurs.

This is a primary reason that the a-Si TFT is difficult to apply to an organic luminescence emitted diode (OLED) which operates while continuously making current flow rather than an LCD which is driven with alternating current.

Since a polycrystalline silicon thin film transistor (poly-Si TFT) having even higher performance than the amorphous silicon (a-Si) TFT has high tens to hundreds of mobility, performance which may be applied to a high-definition display which is difficult to implement in the existing a-Si TFT is shown and an element characteristic deterioration problem depending on the operation is very small as compared with the a-Si TFT.

However, more processes are required to manufacture the poly-Si TFT than the a-Si TFT and the resulting additional equipment investment also needs to be preceded.

Therefore, the p-Si TFT is suitable for application to a product such as the high-definition display or the OLED, but smaller than the existing a-Si TFT in terms of the cost, and as a result, the application cannot but be limited.

Accordingly, a request for a new TFT technology which can take both the advantages (large size, low price, and uniformity) of the a-Si TFT and the advantages (high performance and reliability) of the poly-Si TFT is larger than ever and a research thereinto is in active progress and as the representative technology, an oxide semiconductor TFT is provided.

The oxide semiconductor TFT has higher mobility than the amorphous silicon (a-Si) TFT and is simpler in manufacturing process and small in manufacturing cost than the polycrystalline silicon (poly-Si) TFT, and as a result, the oxide semiconductor TFT is high in utility value in the liquid crystal display (LCD) and the organic luminescence emitting diode (OLED).

Meanwhile, an active layer of the oxide semiconductor TFT as a layer forming a channel in which electrons move may be formed by using low temperature poly silicon (LTPS) having higher mobility of the electrons for a high-resolution and 3D flat display in recent years. As a result, an annealing process needs to be added similarly to a process of forming an electrode of an active matrix organic light emitting diode (AMOLED) which is high in response speed, such as a crystallization process, or the like in order to manufacture the LTPS. As an additional process required for the LTPS, the crystallization process and a high-temperature annealing process are provided and the high-temperature annealing process includes a pre-compaction process, a dehydrogenation annealing process, an activation process, and a hydrogenation annealing process.

In the high-temperature annealing process, the hydrogenation annealing process is used for preventing the electrons which pass silicon (Si) on the surface and therein exists as a dangling bond-state active layer are captured at a dangling bonding place and scattering of the electrons from being deteriorated.

When high-temperature annealing is performed through the hydrogenation annealing process, hydrogen atoms are recoupled to the dangling bonding place in which hydrogen is degassed in the crystallization process to enhance the element characteristic.

However, in the hydrogenation annealing process using an induction heating device or a halogen lamp in the related art, there is no effect even though the element is exposed to a comparatively high temperature of 600 to 1000 C temperature for a long time and the process is performed at a temperature of 500° C. or lower. In particular, a long process time is required, which includes a time required to increase a target process temperature, a time when the annealing process is performed at the process temperature, and a time required to decrease the temperature for a subsequent process after the annealing.

As described above, in the hydrogenation annealing process, high power for the annealing is used as the high temperature is required and further, since the element is exposed to the high temperature for a long time, a defect may occur on anther layer constituting the element, and as a result, a yield decreases. Further, a long stand-by time is required to decrease the temperature of the element for the subsequent process of the hydrogenation annealing process and there is a possibility that the element will be deformed while the temperature of the element decreases. In particular, in manufacturing a flexible display, polyimide needs to be annealed at the high temperature after a curing process of polyimide and in this case, a plastic substrate is also deformed or an organic matter is also combusted through combination with oxygen.

Further, the hydrogenation annealing process needs to be performed by increasing the temperature under a high-vacuum atmosphere in order to prevent the annealed element from being contaminated in the related art.

SUMMARY OF THE INVENTION

The present invention has been made in an effort to provide a hydrogenation annealing method using microwaves, which is appropriate to perform hydrogenation annealing at a low temperature and with low power by using the microwaves for an oxide semiconductor TFT or LTPS having very high mobility of electrons.

The present invention has also been made in an effort to provide a hydrogenation annealing method using microwaves, which is appropriate to perform hydrogenation annealing at a low temperature and with low power by using the microwaves having different frequencies for an oxide semiconductor TFT or LTPS having very high mobility of electrons.

An exemplary embodiment of the present invention provides a hydrogenation annealing method using a microwave including: a loading step of loading a device requiring hydrogenation annealing into a first chamber; and a first annealing step of irradiating a microwave having a frequency in an industrial scientific medical (ISM) band into the first chamber into which the device is loaded.

In the first annealing step, any one microwave of 2.45 GHz, 5.8 GHz, and 9.5 GHz which correspond to the ISM band frequency may be irradiated into the first chamber.

In the first annealing step, the microwave may be irradiated to the first chamber in a state where the inside of the first chamber is set at atmospheric pressure and room temperature.

The first annealing step may be performed for a process time including an annealing time of irradiating the microwave and an idle time of suspending the irradiation of the microwave, and the idle time may be set to be relatively shorter than the annealing time.

In the first annealing step, the microwave may be irradiated multiple times at predetermined time intervals by time division.

In the first annealing step, the microwaves having different frequencies may be repeatedly irradiated by time division. In this case, the first annealing step may include first microwave irradiation step of irradiating the microwave having the first frequency into the first chamber in the state where the different frequencies in the ISM band are set to the first frequency and the second frequency, and second microwave irradiation step of irradiating the microwave having the second frequency into the first chamber.

The hydrogenation annealing method using a microwave may further include a loading step of loading the device into the second chamber by transferring the device for a first time after the first annealing step; and a second annealing time of irradiating a microwave of the ISM band having a different frequency from the first annealing step into the second chamber into which the device is loaded by time division.

The hydrogenation annealing method using a microwave may further include a transfer step of transferring the device after the first annealing step to the second chamber for the first time through a transfer path in which the first chamber and the second chamber are arranged in an inline type and which is provided between the first chamber and the second chamber to shield the microwave.

The device may be an oxide semiconductor device or a silicon semiconductor device which absorbs the whole or a part of the microwave according to a dielectric constant.

DETAILED DESCRIPTION OF THE PREFERRED EMBODIMENTS

Figure 1:
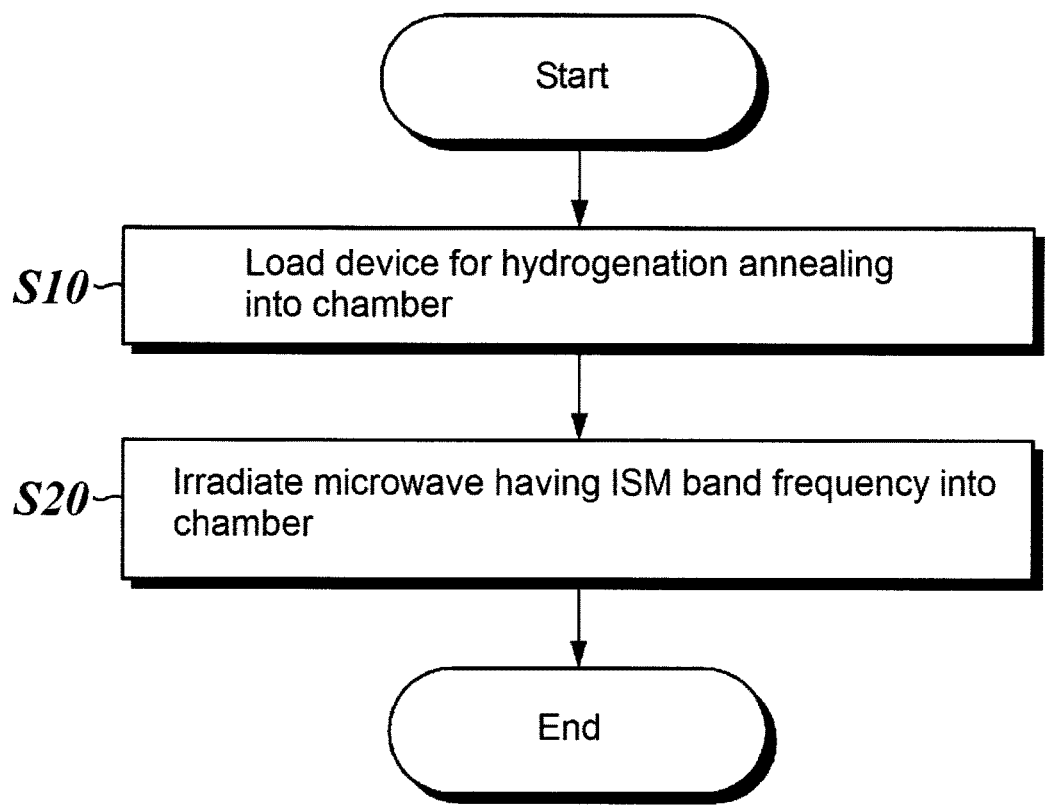
FIG. 1 is a state flowchart illustrating a hydrogenation annealing procedure using microwaves according to an exemplary embodiment of the present invention.

Other objects, features, and advantages of the present invention will be apparent through a detailed description of exemplary embodiments referring to the accompanying drawings.

Hereinafter, a configuration and an operation of an embodiment of the present invention will be described with reference to the accompanying drawings and the configuration and the operation of the present invention illustrated and described in the drawings are described as at least one embodiment and the technical spirit of the present invention and a core configuration and an operation thereof are not limited thereto.

Hereinafter, a preferred embodiment of a hydrogenation annealing method using microwaves according to the present invention will be described in detail with reference to the accompanying drawings.

In the present invention, hydrogenation annealing is performed by using the microwaves, in order to prevent the electrons which pass silicon (Si) on the surface and therein exists as a dangling bond-state active layer are captured at a dangling bonding place and scattering of the electrons from being deteriorated.

The hydrogenation annealing is performed at a low temperature and with low power by using the microwaves, and as a result, hydrogen atoms are recoupled to the dangling bonding place in which hydrogen is degassed in the crystallization process to enhance an element characteristic.

FIG. 1 is a state flowchart illustrating a hydrogenation annealing procedure using microwaves according to an exemplary embodiment of the present invention.

Referring to FIG. 1, a device that requires hydrogenation annealing after a pre-processing process is loaded into a chamber (S10).

The device that requires hydrogenation annealing may be a semiconductor device that entirely or partially absorbs a microwave according to a dielectric constant, such as an oxide semiconductor device, a silicon semiconductor device, or the like.

Further, the pre-processing process before the hydrogenation annealing may include a pre-compaction process for glass, a deposition process of depositing amorphous silicon (a-Si) or oxide on the substrate, a doping process of injecting ions, or the like, and may include a crystallization process, an activation process, or the like.

As an example, in the case of performing hydrogenation annealing using a microwave with respect to an oxide film for an OLED panel, the oxide film is deposited on the substrate and then the device on which the oxide film is deposited is loaded into the chamber.

Next, the annealing is performed by irradiating the microwave having a frequency in an industrial scientific medical (ISM) band into the chamber into which the device is loaded (S20). In the hydrogenation annealing of the present invention, any one microwave of 2.45 GHz, 5.8 GHz, and 9.5 GHz which correspond to the ISM band frequency is irradiated into the chamber.

According to another exemplary embodiment of the present invention, the annealing may be performed by repetitively irradiating microwaves having difference frequencies into the chamber into which the device is loaded by time division. The annealing process will be described through FIG. 3.

Internal conditions of the chamber for the hydrogenation annealing are set at atmospheric pressure and room temperature in the chamber.

Accordingly, when the inside of the chamber is in a state of the atmospheric pressure and the room temperature, the microwave is irradiated. As compared with the related art, it is meant that a preparation time for increasing the temperature to a desired process temperature in the inside of the chamber is not required.

Meanwhile, in the hydrogenation annealing of the present invention, the microwave having the ISM band frequency may be continuously irradiated for a desired process time. However, it is more preferred that the microwaves are repeatedly irradiated at predetermined intervals during a desired process time in consideration of overheating and overload of annealing equipment using microwaves and an increase in the process temperature.

Accordingly, the processing time for the hydrogenation annealing of the present invention may include an annealing time for irradiating the microwaves and an idle time for suspending irradiation of the microwaves. The idle time may be set to the annealing time or less. More preferably, the idle time may be set to be relatively shorter than the annealing time.

Figure 2:
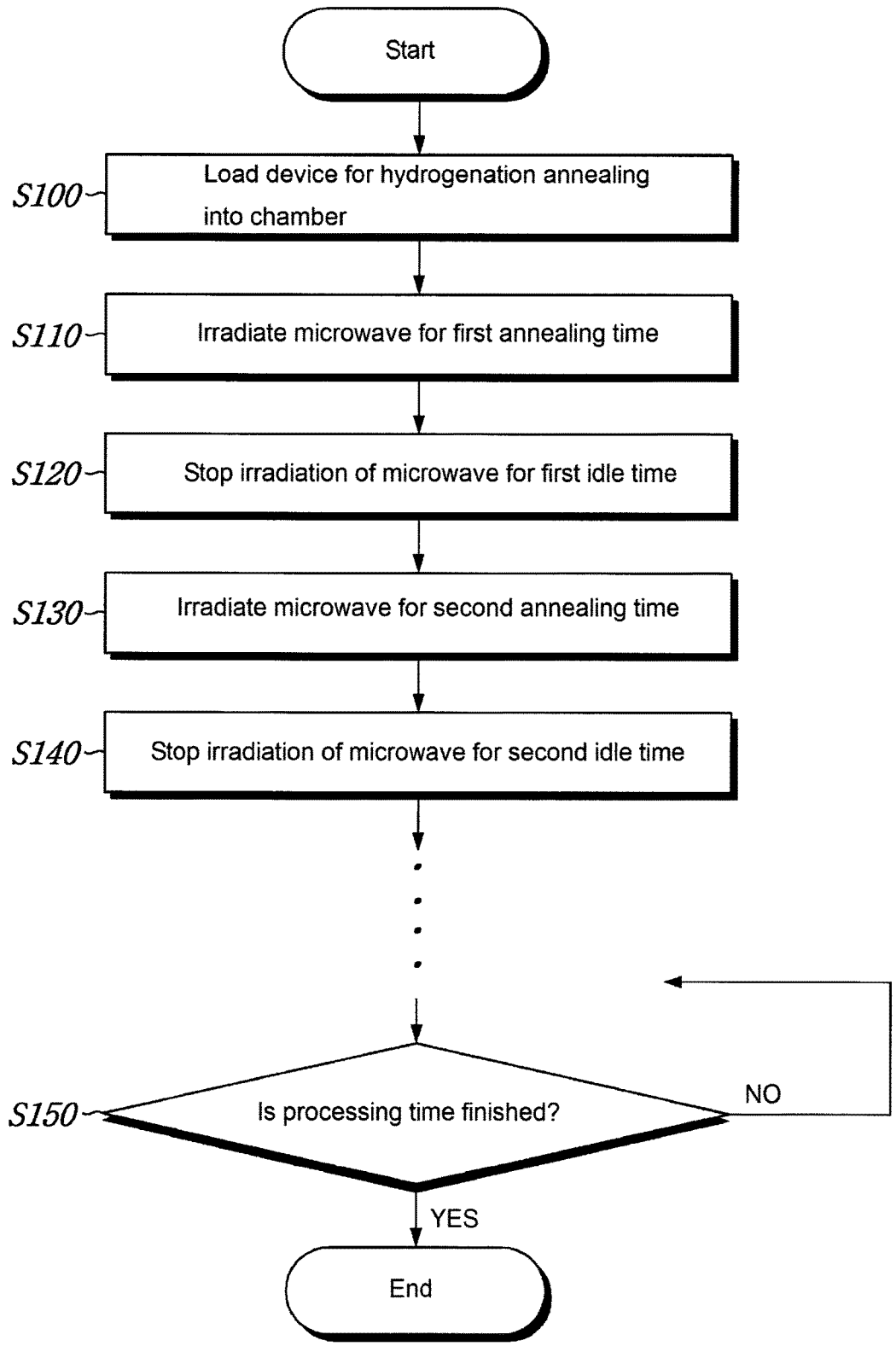
FIG. 2 is a state flowchart illustrating a hydrogenation annealing procedure using microwaves according to another exemplary embodiment of the present invention.

FIG. 2 is a state flowchart illustrating a hydrogenation annealing procedure using microwaves according to another exemplary embodiment of the present invention and illustrates an example of irradiating the microwaves multiple times by time division.

As described above, in the case of the continuous irradiation of the microwaves, since overheating and overload of the annealing equipment using the microwaves of the present invention and the increase in the processing time may occur, the microwaves may be repetitively irradiated by time division.

Referring to FIG. 2, a device requiring hydrogenation annealing after a pre-processing process as illustrated in FIG. 1 is loaded into a chamber (S100).

Next, the microwaves having a frequency in an industrial scientific medical (ISM) band into the chamber into which the device is loaded are irradiated for a first annealing time (S110).

After the first annealing time, the irradiation of the microwaves stops for a first idle time (S120).

After the first idle time, the microwaves having the frequency in the ISM band in the chamber into which the device is loaded are irradiated for a second annealing time (S130).

After the second annealing time, the irradiation of the microwaves stops for a second idle time (S140).

The irradiation (the annealing time) and irradiation stop (the idle time) of the microwaves are repeated until the entire process time (S150).

For example, the annealing time may be set to 1 minute, the idle time may be set to 30 seconds, and the annealing time may be set to a total of 15 minutes to irradiate microwaves 15 times at predetermined time intervals (time division). Here, the idle time is a time for cooling without irradiating the microwave.

As such, the microwaves are irradiated multiple times at the predetermined time intervals by time division to prevent overheating and overload of annealing equipment using the microwaves and solve the increase in the entire process time.

Figure 3:
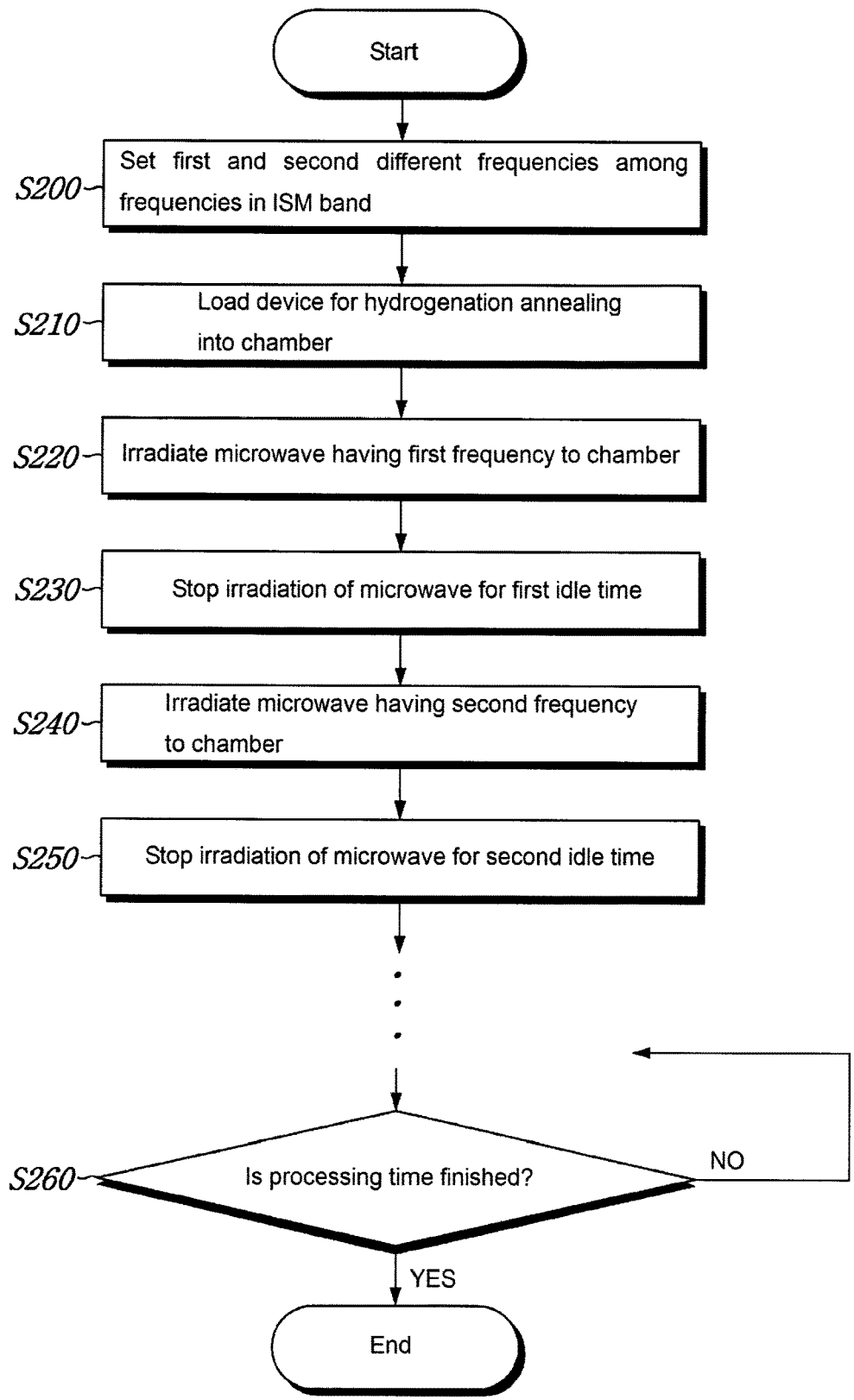
FIG. 3 is a state flowchart illustrating a hydrogenation annealing procedure using microwaves according to yet another exemplary embodiment of the present invention.

FIG. 3 is a state flowchart illustrating a hydrogenation annealing procedure using microwaves according to yet another exemplary embodiment of the present invention and illustrates an example of irradiating the microwaves repetitively at predetermined time intervals by time division.

Referring to FIG. 3, in the annealing according to yet another exemplary embodiment of the present invention, any one microwave of 2.45 GHz, 5.8 GHz, and 9.5 GHz which correspond to the ISM band frequency is irradiated into the chamber by time division. Accordingly, different frequencies among the frequencies of the ISM band are set as a first frequency and a second frequency (S200). More specifically, the first frequency may be a frequency relatively lower than the second frequency. Alternatively, the first frequency may be a frequency relatively higher than the second frequency.

A device requiring hydrogenation annealing after a pre-processing process as illustrated in FIG. 1 is loaded into a chamber (S210).

Next, microwaves having different frequencies are repetitively irradiated into the chamber into which the device is loaded by time division (S220 to S260). Herein, time-divisional repetition irradiation will be described.

As described above, while different frequencies in the ISM band are set to a first frequency and a second frequency, the microwave at the first frequency is irradiated into the chamber [a first microwave irradiation step] (S220).

After the first microwave irradiation step (S220), irradiation of the microwave stops for a first idle time which is set to be relatively shorter than a first annealing time corresponding to the first microwave irradiation step (S230). The first idle time after the first microwave irradiation step S220 may be optionally set.

After the first microwave irradiation process or the first idle time, the microwave at the second frequency which is different from the first frequency is irradiated into the chamber [a second microwave irradiation process] (S240).

The first microwave irradiation step (S220) and the second microwave irradiation step (S240) may be repeatedly performed for a total of desired process time including each idle time (S260).

The first microwave irradiation process (S220) time of irradiating the microwave at the first frequency into the chamber is set to the first annealing time and the second microwave irradiation process (S240) of irradiating the microwaves at the second frequency into the chamber may be set to the second annealing time. The setting of the first annealing time and the second annealing time may be performed in advance when setting the frequency of the microwave before the loading of the device.

The first annealing time and the second annealing time may be equally set or differently set. In detail, the first annealing time and the second annealing time may be set to be inversely proportional to the frequency magnitude of the microwave.

As an example, when the first frequency is set to be higher than the second frequency, the first annealing time may be set to be shorter than the second annealing time. As an example, when the first frequency is set to be lower than the second frequency, the first annealing time may be set to be longer than the second annealing time.

Meanwhile, after the first microwave irradiation process (S220) and the second microwave irradiation process (S240), the irradiation of the microwave stops for a second predetermined idle time (S250). The setting of the second idle time is also optionally adjustable according to a state of the loaded device or equipment like the first idle time.

For example, the time required for the first microwave irradiation process (S220) and the second microwave irradiation process (S240) (the sum of the first annealing time and the second annealing time) is set to 1 minute, and the sum of the first idle time and the second idle time may be set to 30 seconds. Further, the microwaves of different frequencies may be repeatedly irradiated 15 times at predetermined time intervals by setting the total required time obtained by the sum of the first annealing time and the second annealing time to 15 minutes. Here, the first idle time and the second idle time are a time for cooling without irradiating the microwave to the device.

As another example, the sum of the first annealing time and the second annealing time may be set to 2 minutes and the sum of the first idle time and the second idle time may be set to 1 minute. In this case, the first annealing time and the second annealing time are inversely proportional to each other according to different magnitudes of the first frequency and the second frequency and may be different from each other.

The total processing time for the hydrogenation annealing of the present invention may include the first annealing time and the second annealing time of irradiating the microwaves, and the first idle time and the second idle time of suspending the irradiation of the microwaves. The first idle time and the second idle time may be set to be equal to or shorter than the time for irradiating the microwave. For example, the first idle time and the second idle time may be set to be relatively shorter than the first annealing time or the second annealing time. For example, the sum of the first idle time and the second idle time may be set to be relatively shorter than the sum of the first annealing time or the second annealing time.

As such, the microwaves are irradiated multiple times at the predetermined time intervals to prevent overheating and overload of annealing equipment using the microwaves and solve the increase in the entire process time.

The hydrogenation annealing using the microwaves according to the present invention may be performed by using equipment to be described below.

Figure 4:
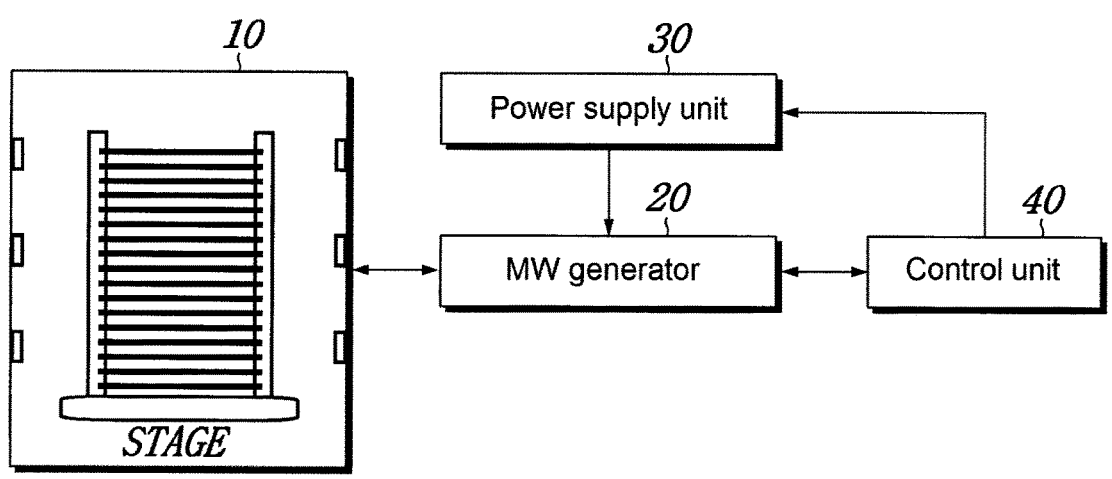
FIG. 4 is a block diagram illustrating a hydrogenation annealing apparatus using microwaves according to an exemplary embodiment of the present invention.

FIG. 4 is a block diagram illustrating a hydrogenation annealing apparatus using microwaves according to an exemplary embodiment of the present invention.

Referring to FIG. 4, a hydrogenation annealing apparatus using microwaves may be constituted by a chamber 10 that loads a device requiring hydrogenation annealing, a microwave generator 20 that generates the microwaves, a power supply unit 30 that supplies power to the microwave generator 20, and a control unit 40 that controls the microwave generator 20 and the power supply unit 30.

The chamber 10 includes a stage for stacking at least one device, and the internal configuration of the chamber 10 including the stage so that the microwave may be smoothly absorbed into the device may be formed of a material through which microwaves can pass. For example, the chamber 10 may include a stage for stacking the devices and a rotator for rotating the stage. Particularly, the stage may be made of a Teflon material through which the microwaves pass.

The generator 20 generates the microwaves at the ISM band frequencies required fro the predetermined annealing time according to a control of the control unit 40. Particularly, the microwave generator 20 generates any one microwave of 2.45 GHz, 5.8 GHz, and 9.5 GHz corresponding to the ISM band frequencies, according to a control of the control unit 40.

The power supply unit 30 supplies power for allowing the microwave generator 20 to generate the microwaves at the ISM band frequencies according to a control of the control unit 40. For example, the power supply unit 30 may supply power of 400 to 1000 watts so that the microwave generator 20 generates the microwave of 2.45 GHz.

The control unit 40 controls the microwave generator 20 to generate any one microwave of 2.45 GHz, 5.8 GHz and 9.5 GHz corresponding to the ISM band frequencies and controls the microwave generator 20 to generate the microwave repeatedly for the annealing time at an interval of the aforementioned idle time. In addition, the control unit 40 controls the power supply unit 30 to supply the power in synchronization with a microwave generation cycle of the microwave generator 20.

As additional example, the control unit 40 senses a temperature of the inside of the chamber 10 or the device for hydrogenation annealing and may perform a control for preventing overheating by adjusting at least one of the aforementioned annealing time and idle time when the sensing temperature is higher than a reference temperature.

Meanwhile, the hydrogenation annealing apparatus using the microwaves may further include a waveguide for guiding the microwave generated in the microwave generator 20 to the chamber 10 and a reflection plate for concentrating the microwave guided through the waveguide in the devices loaded into the chamber 10 may be further included in the chamber 10. In particular, it is preferred that the reflection plate reflects the microwave in a direction in which the device is positioned in the chamber 10, and to this end, the reflection plate may be provided on the inner wall of the chamber 10.

Figure 5:
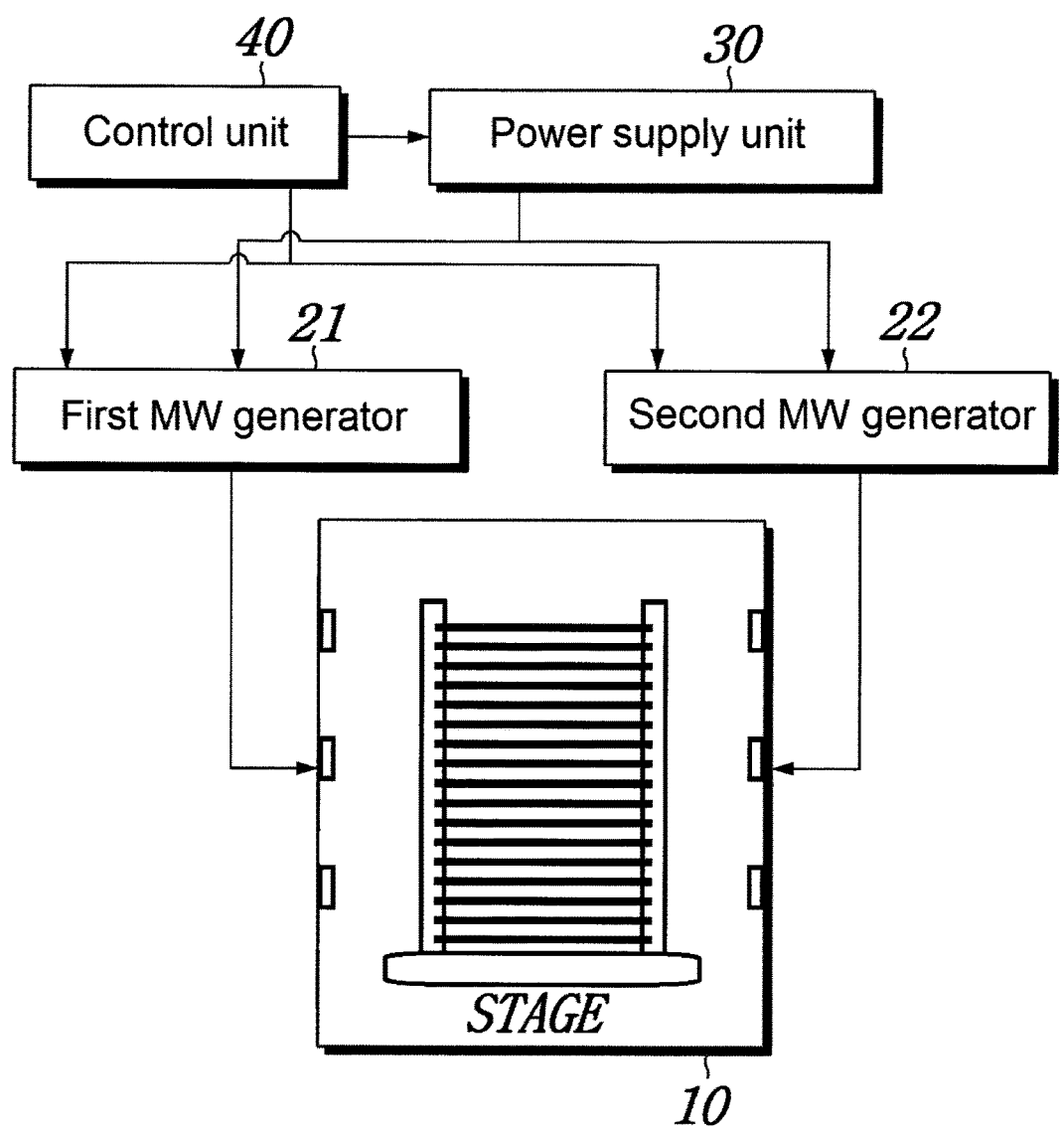
FIG. 5 is a block diagram illustrating a hydrogenation annealing apparatus using microwaves according to another exemplary embodiment of the present invention.

FIG. 5 is a block diagram illustrating a hydrogenation annealing apparatus using microwaves according to another exemplary embodiment of the present invention and illustrates an example of performing annealing by repeatedly irradiating the microwaves having different frequencies by time division. In FIG. 5, like configurations as FIG. 4 will be described by using like reference numerals.

Referring to FIG. 5, a hydrogenation annealing apparatus for repeatedly irradiating microwaves having different frequencies by time division may be constituted by a chamber 10 that loads a device requiring hydrogenation annealing, first and second microwave generators 20 and 21 that generate the microwaves having different frequencies, a power supply unit 30 that supplies power to the first and second microwave generators 20 and 21, and a control unit 40 that controls the first and second microwave generators 20 and 21 and the power supply unit 30.

Since the chamber 10 is the same as those described in FIG. 4, description thereof will be omitted.

The first and second microwave generators 20 and 21 generate microwaves having ISM band frequencies required for a predetermined time according to a control of the control unit 40. Particularly, the first and second microwave generators 20 and 21 generate any one microwave of 2.45 GHz, 5.8 GHz, and 9.5 GHz corresponding to the ISM band frequencies, according to a control of the control unit 40.

The first and second microwave generators 20 and 21 generate microwaves having different frequencies according to a control of the control unit 40.

The first microwave generator 20 generates a microwave having a first frequency among the frequencies of the ISM band and the second microwave generator 21 generates a microwave having a second frequency of the frequencies of the ISM band.

More specifically, the first frequency may be a frequency relatively lower than the second frequency. Alternatively, the first frequency may be a frequency relatively higher than the second frequency.

According to the control of the control unit 40, the power supply unit 30 supplies the power for generating the microwaves to the first and second microwave generators 20 and 21 in response to the times when the first and second microwave generators 20 and 21 irradiate the set frequencies, respectively.

The control unit 40 controls the first and second microwave generators 20 and 21 to generate any one microwave of 2.45 GHz, 5.8 GHz and 9.5 GHz corresponding to the ISM band frequencies and controls the first and second microwave generators 20 and 21 to generate the microwave repeatedly for the first annealing time and/or the second annealing time at an interval of the aforementioned idle time. In addition, the control unit 40 controls the power supply unit 30 to supply the power in synchronization with a microwave generation cycle of the first and second microwave generators 20 and 21.

As additional example, the control unit 40 senses a temperature of the inside of the chamber 10 or the device for hydrogenation annealing and may perform a control for preventing overheating by adjusting at least one of the aforementioned first and second annealing times and idle time when the sensing temperature is higher than a reference temperature.

Meanwhile, the hydrogenation annealing apparatus of irradiating the microwaves having different frequencies by time division may further include a waveguide for guiding the microwave generated in the first and second microwave generators 20 and 21 to the chamber 10 and a reflective plate for concentrating the microwave guided through the waveguide in the devices loaded into the chamber 10 may be further included in the inner wall of the chamber 10.

Figure 6:
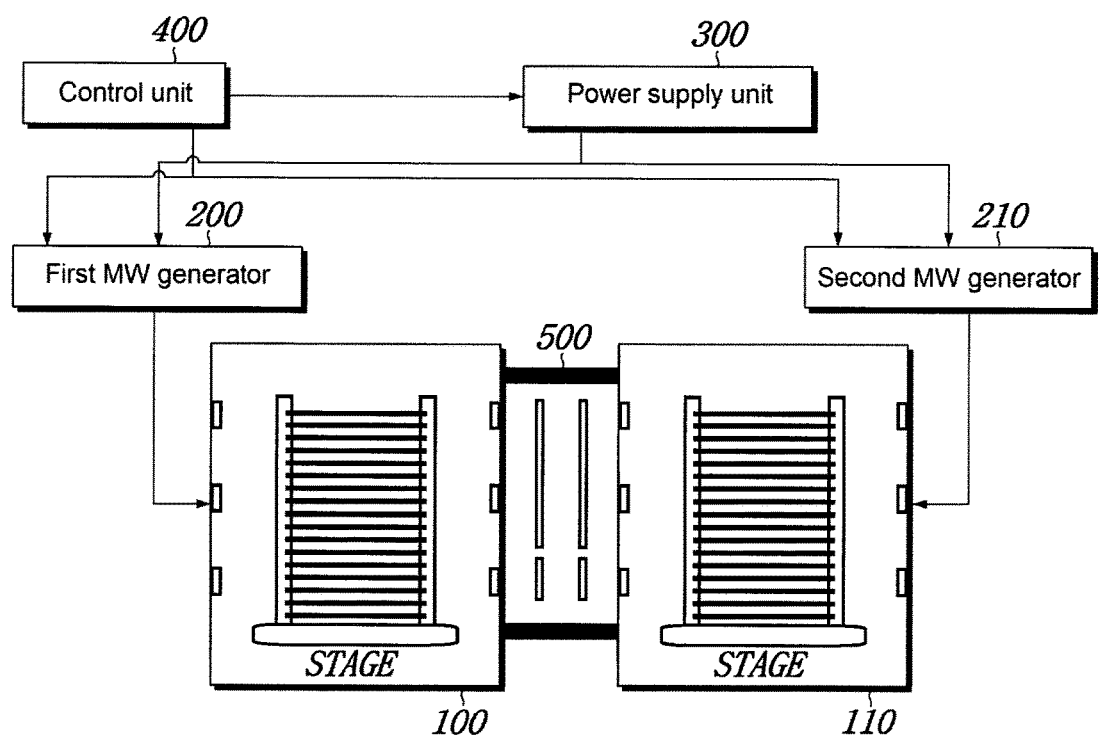
FIG. 6 is a block diagram illustrating a hydrogenation annealing apparatus using microwaves according to yet another exemplary embodiment of the present invention.

FIG. 6 is a block diagram illustrating a hydrogenation annealing apparatus using microwaves according to yet another exemplary embodiment of the present invention and illustrates an example of performing annealing by repeatedly irradiating the microwaves having the same frequency or different frequencies by time division in a plurality of chambers arranged in an inline type.

Referring to FIG. 6, a hydrogenation annealing apparatus using microwaves according to yet another exemplary embodiment of the present invention may be constituted by a first chamber 100 and a second chamber 110 that load a device requiring hydrogenation annealing, a shield transfer path 500 that transfers the device between the first chamber 100 and the second chamber 110, first and second microwave generators 200 and 210 that generate microwaves having different frequencies, a power supply unit 30 that supplies power to the first and second microwave generators 200 and 210, and a control unit 400 that controls the first and second microwave generators 200 and 210 and the power supply unit 300.

The first chamber 100 and the second chamber 110 include stages for stacking at least one or more devices, respectively.

Since respective internal configuration and manufacturing materials of the first chamber 100 and the second chamber 110 including the stages are the same as those of the chambers illustrated in FIGS. 4 and 5, the description will be described.

The first and second microwave generators 200 and 210 generate microwaves having ISM band frequencies required for a predetermined time according to a control of the control unit 400. Particularly, the first and second microwave generators 200 and 210 generate any one microwave of 2.45 GHz, 5.8 GHz, and 9.5 GHz corresponding to the ISM band frequencies, according to a control of the control unit 400.

The first and second microwave generators 200 and 210 generate microwaves having different frequencies according to a control of the control unit 400. As another example, the first and second microwave generators 200 and 210 may generate one microwave having the same frequency according to a control of the control unit 400 and in this case, only one microwave generator may also be provided.

In the case of generating the microwaves having different frequencies, the first microwave generator 200 generates a microwave having a first frequency among the frequencies of the ISM band and the second microwave generator 210 generates a microwave having a second frequency of the frequencies of the ISM band. Herein, the first frequency may be a frequency relatively lower than the second frequency. Alternatively, the first frequency may be a frequency relatively higher than the second frequency.

According to the control of the control unit 400, the power supply unit 300 supplies the power for generating the microwaves to the first and second microwave generators 200 and 210 in response to the times when the first and second microwave generators 200 and 210 irradiate the set frequencies, respectively.

The control unit 40 controls the first and second microwave generators 200 and 210 to generate any one microwave of 2.45 GHz, 5.8 GHz and 9.5 GHz corresponding to the ISM band frequencies.

The control unit 400 controls a first annealing time for first annealing performed by the first chamber 100. The first annealing time may include first to N-th irradiation times in which the microwave having the first frequency is irradiated into the first chamber 100 N times by time division, and a k-th idle time which stops the irradiation of the microwave between the k-th irradiation time and the (k+1)-th irradiation time. Herein, k may be 1≤k≤(N-1).

The control unit 400 controls a second annealing time for second annealing performed by the second chamber 110. The second annealing time may include first to M-th irradiation times in which the microwave having the second frequency is irradiated into the second chamber 120 M times by time division, and an x-th idle time which stops the irradiation of the microwave between the x-th irradiation time and the (x+1)-th irradiation time. Herein, x may be 1≤x≤(M-1).

As such, the controller 400 controls the first and second microwave generators 200 and 210 to repeatedly generate microwaves at the first to N-th irradiation times and/or the first to M-th irradiation times at intervals of the idle time. In addition, the control unit 400 controls the power supply unit 300 to supply the power in synchronization with a microwave generation cycle of the first and second microwave generators 200 and 210.

As additional example, the control unit 400 senses a temperature of the inside of the first chamber 100 or the second chamber 110 or the device for hydrogenation annealing and may perform a control for preventing overheating by adjusting at least one of the aforementioned k-th irradiation time, x-th irradiation time, k-th idle time, and x-th idle time when the sensing temperature is higher than a reference temperature.

Meanwhile, the hydrogenation annealing apparatus of irradiating the microwaves having different frequencies by time division may further include waveguides for guiding the microwaves generated in the first and second microwave generators 200 and 210 to the first chamber 100 and the second chamber 110, respectively, and reflective plates for concentrating the microwaves guided through the waveguides in the devices loaded into the first chamber 100 and the second chamber 110 may be further included in the first chamber 100 and the second chamber 110, respectively. In particular, it is preferred that the reflection plates may be provided on the inner walls of the chambers 100 and 110 to reflect the microwaves in a direction in which the devices are positioned in the chambers 100 and 110.

The shield transfer path 500 transferring the device between the first chamber 100 and the second chamber 110 is a structure in which the microwave is shielded and the device after the first annealing is transferred from the first chamber 100 to the second chamber 110 for the first time. Herein, the first time corresponding to the transfer time of the device may be controlled by the control unit 400 by considering a device cooling state.

The shield transfer path 500 may be a structure for separately transferring the device, but may be a structure of transferring a stage where a plurality of devices provided in the chambers 110 and 110 is stacked for improving yield.

The hydrogenation annealing according to the present invention needs to be required at a high-vacuum atmosphere in the chamber. Therefore, expensive components such as a vacuum pump, a vacuum gauge, and a vacuum valve for making the inside of the chamber into a high-vacuum atmosphere are not required.

The hydrogenation annealing according to the present invention may be applied to annealing of oxides such as LTPS or IGZO for manufacturing a high resolution LCD, annealing of oxides such as LTPS or IGZO for manufacturing an AMOLED, and annealing for polyimidization when manufacturing a flexible display. In the case of an oxide semiconductor, the hydrogenation annealing according to the present invention may also be applied to annealing of IGZO, IZO, ZTO, and AZTO.

According to the present invention above, hydrogenation annealing is performed at a low temperature by using microwaves for an oxide semiconductor TFT or LTPS having very large electron mobility. Accordingly, highly integrated energy is transferred to the device by the microwave, and thus recoupling of hydrogen atoms, which may be performed only at a high temperature, is realized even at a low temperature.

Since the hydrogenation annealing is performed by using the microwave, there is no temperature rise of the device itself.

For a preparation time or a subsequent process for increasing to a desired process temperature, a waiting time for lowering the device temperature is not required and defects of other layers such as a substrate due to a long waiting time are not generated.

Because selective annealing may be performed from inside of the target device by using the microwave, rapid annealing and uniform annealing are possible and heat loss is very small.

As a result, an apparatus for annealing at a high temperature, an apparatus for cooling, or high power is not required, thereby reducing facility cost, and further, the probability of device defects is significantly lowered and the entire process time is shortened, thereby improving yield and productivity.

Further, it is possible to prevent the device from being contaminated even if the hydrogenation annealing is not performed while increasing the temperature in a high-vacuum atmosphere.

Since the temperature rise may be prevented by using the microwaves, it is possible to solve the problem of deformation of the plastic substrate and combustion of organic substances in the production of a flexible display. Accordingly, the present invention can be applied to a flexible display process.

Although preferred embodiments of the present invention have been described up to now, those skilled in the art will be able to implement in a modified form within a scope without departing from an essential characteristic of the present invention.

Therefore, the exemplary embodiments of the present invention described herein need to be considered from a limited viewpoint but an explanatory viewpoint and the scope of the present invention is shown in not the description but the claims and it should be interpreted that all differences within the scope equivalent thereto are included in the present invention.

DESCRIPTION OF SYMBOLS 10, 100, 110: Chamber
20, 21, 22, 200, 210: Microwave generator
30, 300: Power supply unit
40, 400: Control unit
500: Shield transfer path

What is claimed is:
1. A hydrogenation annealing method using microwaves, comprising:
    a loading step of loading a device requiring hydrogenation annealing into a first chamber;
    a first microwave irradiation step of irradiating microwaves having a first frequency in an industrial scientific medical (ISM) band into the first chamber for a first annealing time; and
    a second microwave irradiation step of irradiating microwaves having a second frequency in the ISM band into the first chamber for a second annealing time, the second frequency being different from the first frequency,
    wherein the first and second annealing times are set to be different from each other,
    wherein when the first frequency is higher than the second frequency, the first annealing time is set to be shorter than the second annealing time, and when the first frequency is lower than the second frequency, the first annealing time is set to be longer than the second annealing time, wherein an idle time of suspending irradiation of the microwave having the first frequency is set between the first microwave irradiation step and the second microwave irradiation step, wherein the idle time is set to be relatively shorter than the first annealing time and the second annealing time.

2. The hydrogenation annealing method of claim 1, wherein the first frequency is a frequency which is relatively lower than the second frequency.

3. The hydrogenation annealing method of claim 1, wherein the first frequency is a frequency which is relatively higher than the second frequency.

4. The hydrogenation annealing method of claim 1, wherein the device is an oxide semiconductor device or a silicon semiconductor device.

5. The hydrogenation annealing method of claim 1, wherein the first frequency in the ISM band is any one of 2.45 GHz, 5.8 GHz, and 9.5 GHz.

6. The hydrogenation annealing method of claim 1, wherein the second frequency in the ISM band is any one of 2.45 GHz, 5.8 GHz, and 9.5 GHz.

7. The hydrogenation annealing method of claim 1, wherein in the first microwave irradiation step the microwaves having the first frequency are irradiated to the first chamber in a state where an inside of the first chamber is set to an atmospheric pressure and room temperature.

\* \* \* \* \*